United States Patent
Lin

(10) Patent No.: US 9,748,167 B1
(45) Date of Patent: Aug. 29, 2017

(54) SILICON INTERPOSER, SEMICONDUCTOR PACKAGE USING THE SAME, AND FABRICATION METHOD THEREOF

(71) Applicant: UNITED MICROELECTRONICS CORP., Hsin-Chu (TW)

(72) Inventor: Ming-Tse Lin, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/219,230

(22) Filed: Jul. 25, 2016

(51) Int. Cl.
| | |
|---|---|
| H01L 23/48 | (2006.01) |
| H01L 23/498 | (2006.01) |
| H01L 25/18 | (2006.01) |
| H01L 23/00 | (2006.01) |
| H01L 21/48 | (2006.01) |
| H01L 23/31 | (2006.01) |
| H01L 21/56 | (2006.01) |

(52) U.S. Cl.
CPC ...... *H01L 23/49838* (2013.01); *H01L 21/486* (2013.01); *H01L 21/4853* (2013.01); *H01L 21/4857* (2013.01); *H01L 21/565* (2013.01); *H01L 23/3114* (2013.01); *H01L 23/49822* (2013.01); *H01L 23/49827* (2013.01); *H01L 23/49866* (2013.01); *H01L 23/49894* (2013.01); *H01L 24/16* (2013.01); *H01L 25/18* (2013.01); *H01L 2224/16227* (2013.01)

(58) Field of Classification Search
CPC ........... H01L 23/49838; H01L 23/4853; H01L 23/3114; H01L 23/49822; H01L 23/49827
USPC .................................. 257/778, 774
See application file for complete search history.

(56) References Cited

U.S. PATENT DOCUMENTS

| | | | | |
|---|---|---|---|---|
| 5,399,898 | A * | 3/1995 | Rostoker | G03F 7/70433 257/499 |
| 6,087,719 | A * | 7/2000 | Tsunashima | H01L 21/76898 250/548 |
| 8,084,869 | B2 * | 12/2011 | Miwa | H05K 1/112 257/734 |
| 8,115,292 | B2 * | 2/2012 | Toh | H01L 21/486 257/686 |
| 8,884,433 | B2 * | 11/2014 | Lin | H01L 21/76801 257/691 |
| 9,437,583 | B1 * | 9/2016 | Shih | H01L 25/105 |
| 9,548,240 | B2 * | 1/2017 | Lin | H01L 21/76879 |

(Continued)

OTHER PUBLICATIONS

K. Zoschke, Evaluation of Thin Wafer Processing using a Temporary Wafer Handling System as Key Technology for 3D System Integration, 2010 Electronic Components and Technology Conference, 1385-1392.

*Primary Examiner* — Nitin Parekh
(74) *Attorney, Agent, or Firm* — Winston Hsu

(57) ABSTRACT

A silicon interposer includes a substrate having a frontside surface and a backside surface, a first redistribution layer (RDL) structure disposed on the frontside surface, a plurality of first connecting elements disposed on the first RDL structure, a second RDL structure disposed on the backside surface, a plurality of second connecting elements disposed on the second RDL structure, and a plurality of through silicon vias in the substrate to electrically connect the first RDL structure to the second RDL structure. The first connecting elements have a first pitch. The second connecting elements have a second pitch. The second pitch is greater than the first pitch.

23 Claims, 9 Drawing Sheets

(56) References Cited

U.S. PATENT DOCUMENTS

| | | | |
|---|---|---|---|
| 2003/0160325 A1* | 8/2003 | Yoneda | H01L 21/4846 257/758 |
| 2009/0127668 A1* | 5/2009 | Choi | H01L 24/14 257/621 |
| 2010/0102428 A1* | 4/2010 | Lee | H01L 25/0657 257/686 |
| 2011/0031619 A1* | 2/2011 | Chen | H01L 21/563 257/738 |
| 2013/0037944 A1* | 2/2013 | Lee | H01L 25/0657 257/737 |
| 2013/0313012 A1* | 11/2013 | Yang | H01L 21/6835 174/266 |
| 2014/0027925 A1* | 1/2014 | Tseng | H01L 23/481 257/774 |
| 2014/0217620 A1* | 8/2014 | Yamagishi | H01L 23/315 257/787 |
| 2014/0242752 A1 | 8/2014 | Park | |
| 2017/0092594 A1* | 3/2017 | Song | H01L 23/552 |

\* cited by examiner

SILICON INTERPOSER, SEMICONDUCTOR PACKAGE USING THE SAME, AND FABRICATION METHOD THEREOF

BACKGROUND OF THE INVENTION

1. Field of the Invention

The present invention relates to the field of semiconductor packaging. More particularly, the present invention relates to a silicon interposer, semiconductor package using the same, and a fabrication method of making the same.

2. Description of the Prior Art

Integrated circuits are typically assembled into packages that are soldered to a printed circuit board. Each integrated circuit may be connected to a substrate of the package with a number of solder bumps in a process commonly referred to as controlled collapsed chip connection (C4).

2.5 D packaging and interconnect technology is a promising semiconductor packaging technology that provides costs and reliability savings over 3D packaging technology. 2.5 D packaging technology is a fast growing packaging technology which allows the integration of homogenous and non-homogenous chips on an interposer for enhanced performance and miniaturization.

FIG. 1 illustrates a conventional 2.5D IC package. In a 2.5D IC package, multiple chips 10 and 20 are mounted on an "interposer" structure 30 such as a passive silicon interposer, which is responsible for the interconnections between the chips 10 and 20, as well as the external I/Os on the package substrate 40 through the use of through silicon vias (TSVs) 32.

It is desirable to provide an improved semiconductor package and a method of fabricating the same without the need of using the package substrate.

SUMMARY OF THE INVENTION

According to one embodiment of the invention, the silicon interposer comprises a substrate having a frontside surface and a backside surface, a first redistribution layer (RDL) structure disposed on the frontside surface, a plurality of first connecting elements disposed on the first RDL structure, a second RDL structure disposed on the backside surface, a plurality of second connecting elements disposed on the second RDL structure, and a plurality of through silicon vias (TSVs) in the substrate to electrically connect the first RDL structure to the second RDL structure. The first connecting elements have a first pitch. The second connecting elements have a second pitch. The second pitch is greater than the first pitch.

According to another embodiment of the invention, a semiconductor package includes a silicon interposer. The silicon interposer comprises a substrate having a frontside surface and a backside surface, a first redistribution layer (RDL) structure disposed on the frontside surface, a plurality of first connecting elements disposed on the first RDL structure, a second RDL structure disposed on the backside surface, a plurality of second connecting elements disposed on the second RDL structure, and a plurality of through silicon vias (TSVs) in the substrate to electrically connect the first RDL structure to the second RDL structure. The first connecting elements have a first pitch. The second connecting elements have a second pitch. The second pitch is greater than the first pitch. The semiconductor package further includes a first semiconductor die mounted on the first RDL structure through the plurality of first connecting elements. The semiconductor package further includes a second semiconductor die mounted on the first RDL structure adjacent to the first semiconductor die.

According to still another embodiment of the invention, a method of fabricating a silicon interposer is disclosed. A substrate having a frontside surface and a backside surface is provided. A plurality of through silicon vias (TSVs) is formed in the substrate. A first redistribution layer (RDL) structure is formed on the frontside surface. A plurality of first connecting elements is formed on the first RDL structure. A carrier is attached to the first RDL structure and the first connecting elements. The backside surface of the substrate is subjected to a grinding process to expose ends of the TSVs. A second RDL structure is formed on the backside surface. A plurality of second connecting elements is formed on the second RDL structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
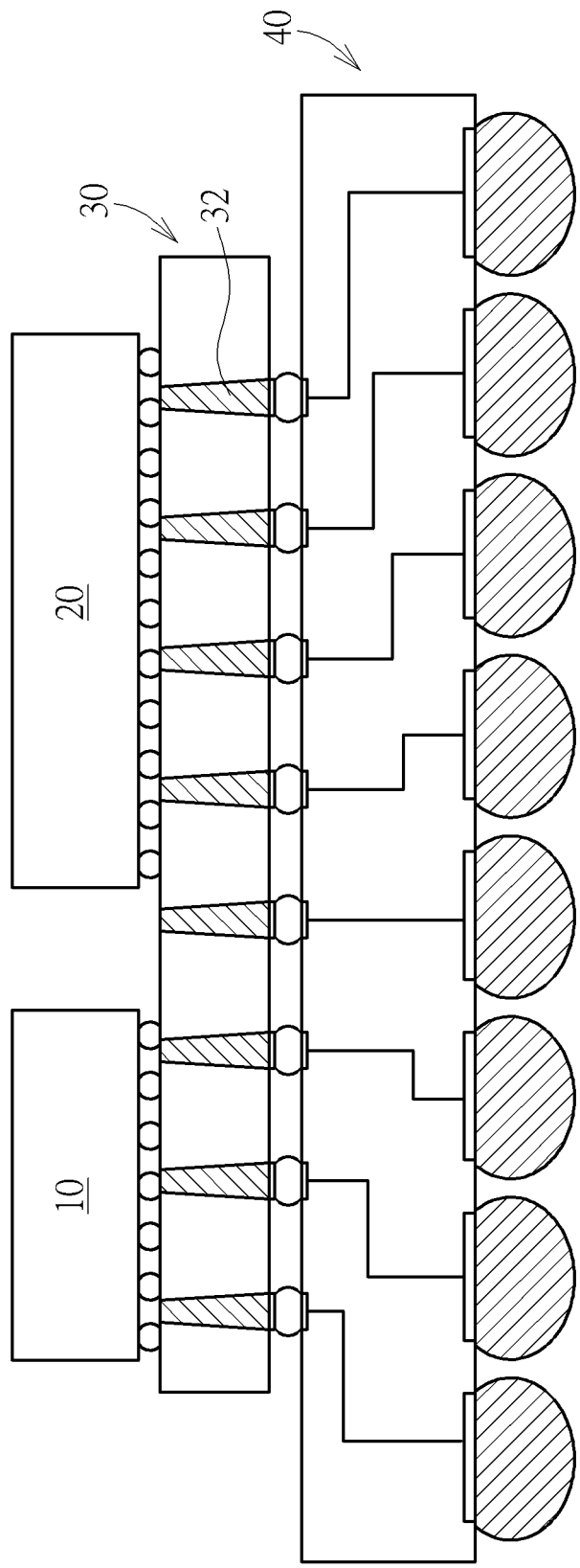
FIG. 1 illustrates a conventional 2.5D IC package.

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled. One or more implementations of the present invention will now be described with reference to the attached drawings, wherein like reference numerals are used to refer to like elements throughout, and wherein the illustrated structures are not necessarily drawn to scale.

Figure 2:
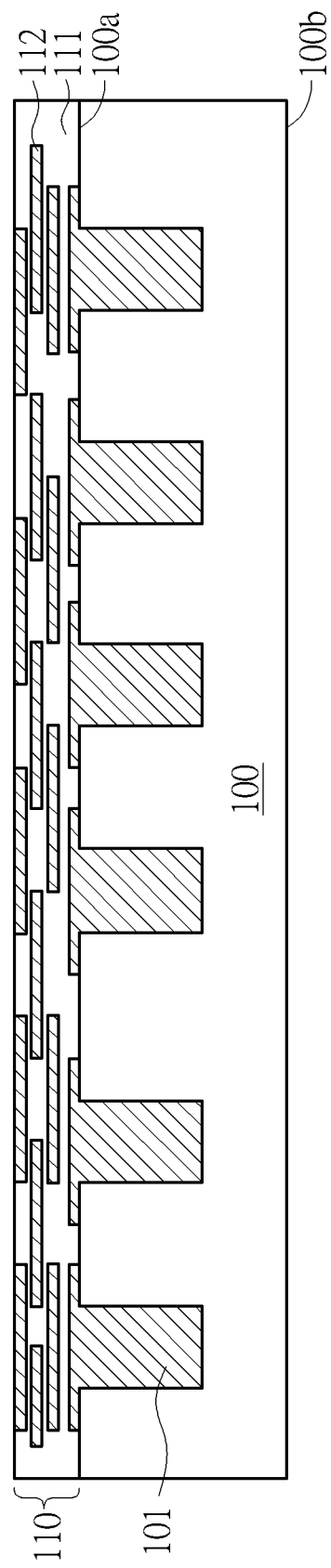
FIG. 2 to FIG. 8 are schematic, cross-sectional diagrams showing an exemplary method of fabricating a silicon interposer.

Please refer to FIG. 2 to FIG. 8. FIG. 2 to FIG. 8 are schematic, cross-sectional diagrams showing an exemplary method of fabricating a silicon interposer. As shown in FIG. 2, a substrate 100 is provided. For example, the substrate 100 may be a silicon substrate. The substrate 100 has a frontside surface 100*a* and a backside surface 100*b*. A plurality of through silicon vias (TSVs) 101 is formed in the substrate 100. A first redistribution layer (RDL) structure 110 is formed on the frontside surface 100*a* of the substrate 100. The TSVs 101 extend from the frontside surface 100*a* into the substrate 100 to a predetermined depth.

According to the embodiment of the invention, the first RDL structure 110 comprises at least an inorganic dielectric film 111 and a fine-pitch rewiring layer 112 that is interconnected with the TSVs 101. The inorganic dielectric film 111 may comprise silicon oxide or silicon nitride, but is not limited thereto. The fine-pitch rewiring layer 112 may comprise copper, titanium, titanium nitride, or tungsten, but is not limited thereto.

Figure 3:
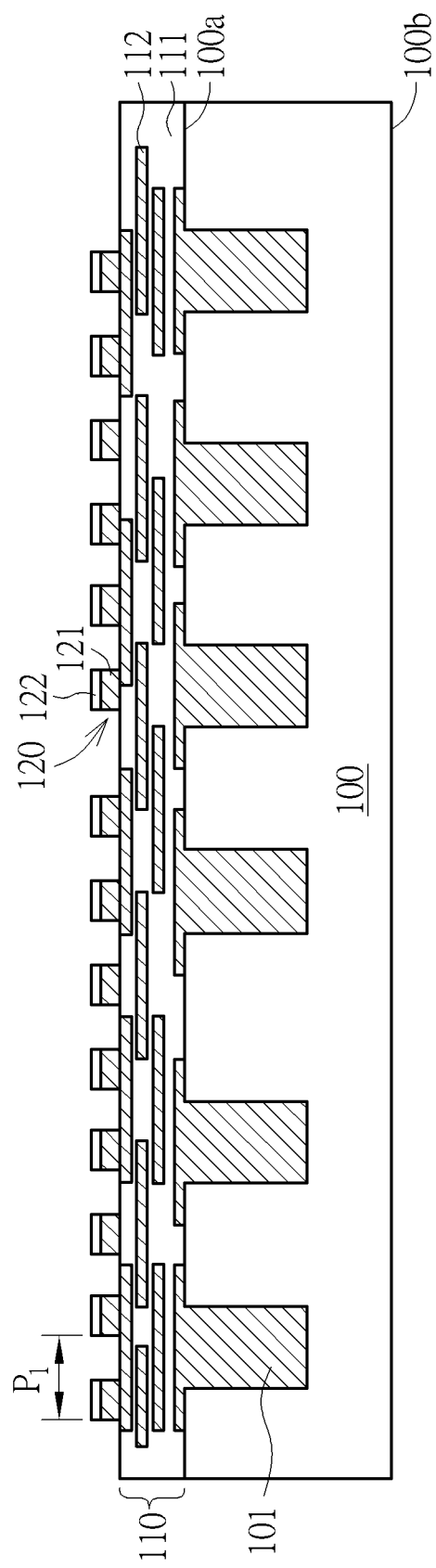

As shown in FIG. 3, a plurality of first connecting elements 120 such as bumps or pillars may be formed on the first RDL structure 110. For example, each of the first connecting elements 120 may comprise a copper layer 121 and a cap layer 122 containing nickel or gold. According to the embodiment of the invention, the first connecting elements 120 have a first pitch $P_1$. According to the embodiment of the invention, the first connecting elements 120 are micro bumps and the first pitch $P_1$ is greater than 5 um.

Figure 4:
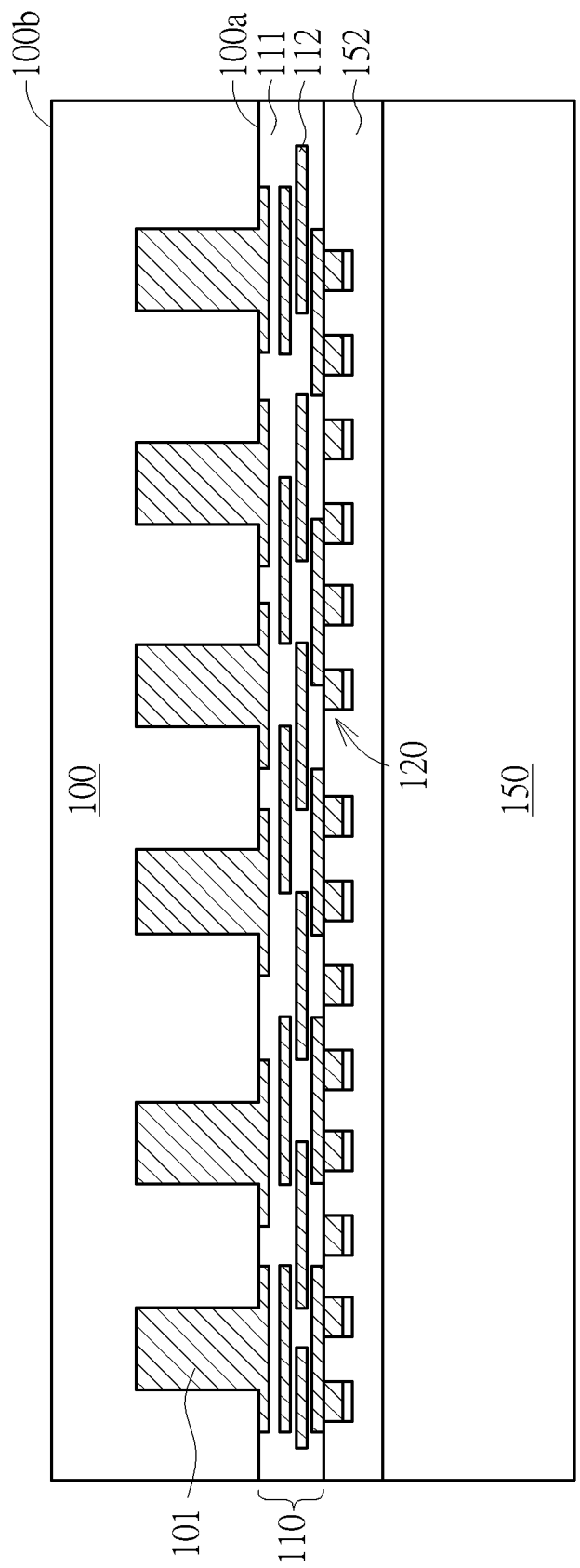

As shown in FIG. 4, a carrier 150 is attached to the first RDL structure 110 and the first connecting elements 120 using a glue layer or an adhesive layer 152. According to the embodiment of the invention, the carrier 150 may comprise silicon or glass, but is not limited thereto.

Figure 5:
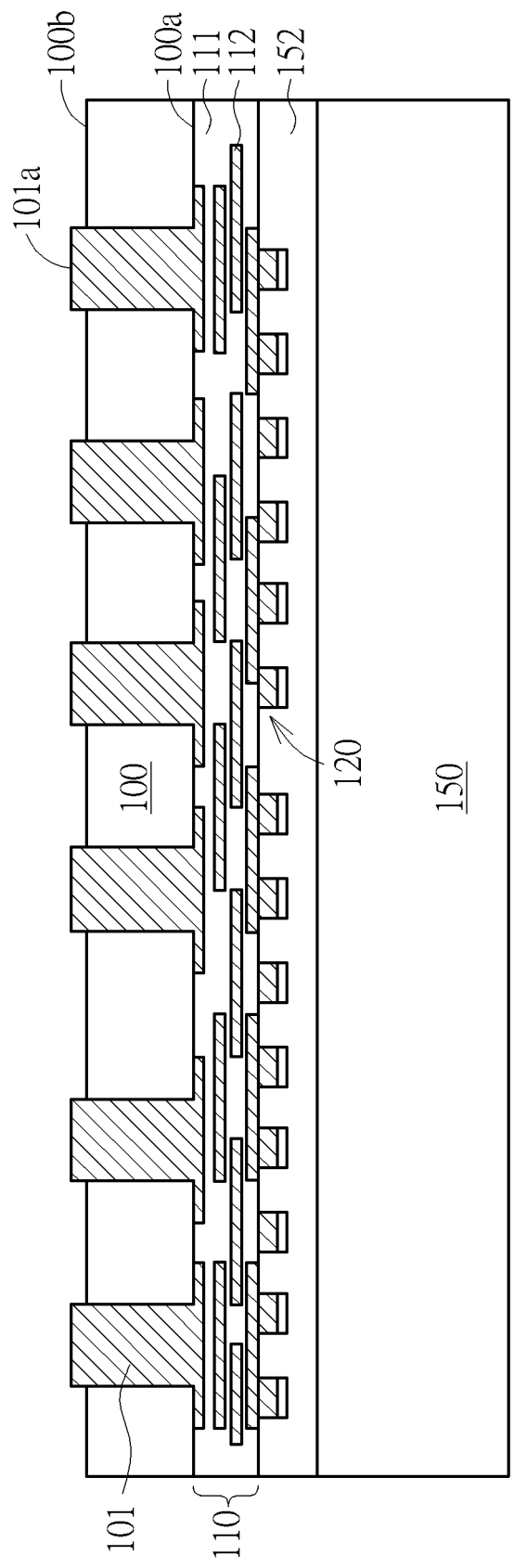

As shown in FIG. 5, a wafer grinding process and an optional wafer edge trimming process are performed to grind the backside surface 100b of the substrate 100 until ends 101a of the TSVs 101 are exposed and to optionally trim wafer edge. According to the embodiment, the ends 101a of the TSVs 101 may protrude from the backside surface 100b of the substrate 100 after the wafer grinding process.

Figure 6:
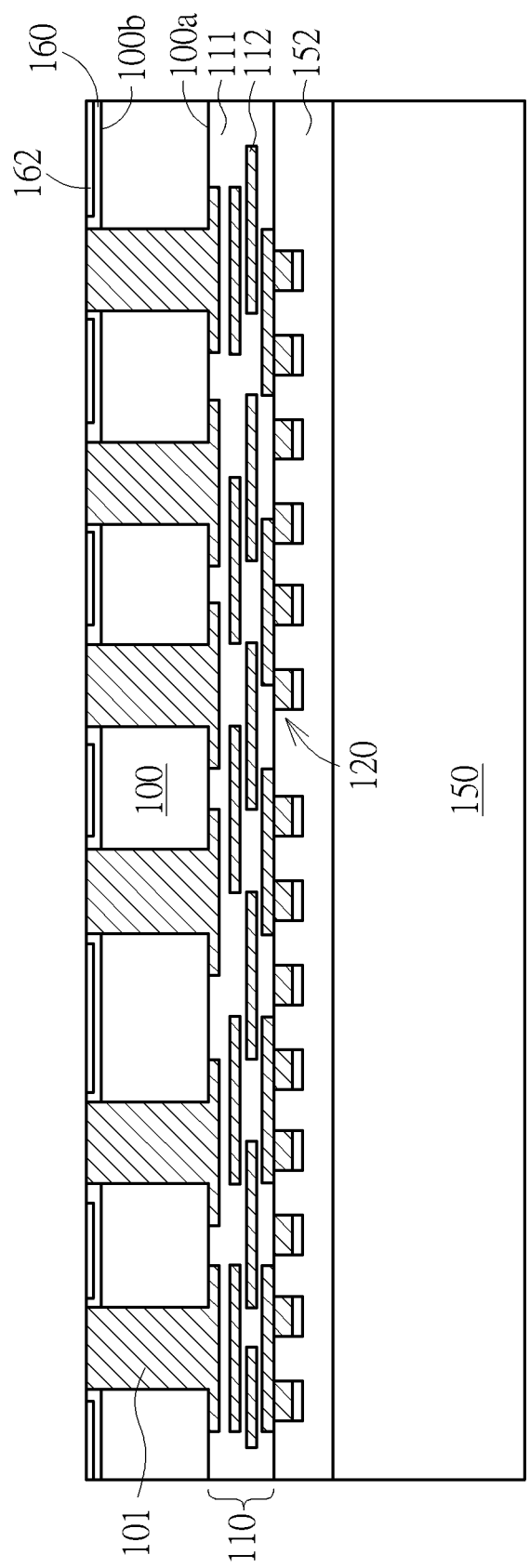

As shown in FIG. 6, at least a passivation layer 160 and a dielectric layer 162 are deposited on the exposed ends 101a of the TSVs 101 and on the backside surface 100b of the substrate 100. Subsequently, a polishing process may be performed to remove a portion of the dielectric layer 162 and a portion of the passivation layer 160 to reveal the ends 101a of the TSVs 101. The passivation layer 160 surrounds the protruding ends 101a of the plurality of the TSVs 101.

Figure 7:
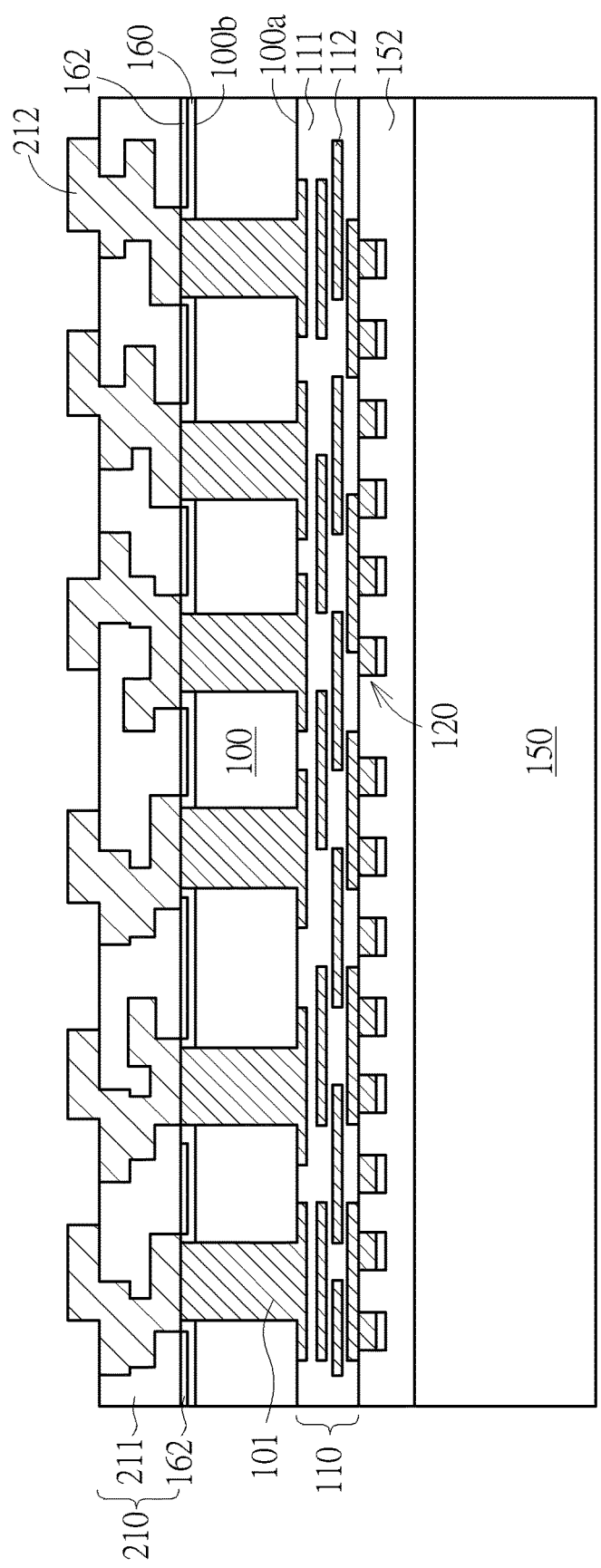

As shown in FIG. 7, a second RDL structure 210 is formed on the backside surface 100b of the substrate 100 using PCB processes. The second RDL structure 210 may comprise at least an organic dielectric film 211 and at least a trace 212 that is interconnected with the TSVs 101. For example, the organic dielectric film 211 may comprise polyimide (PI), benzocyclobutene (BCB), anjinomoto build up film (ABF), or the like. The trace 212 may comprise copper, but is not limited thereto. Subsequently, the carrier 150 and the adhesive layer 152 are removed.

Figure 8:
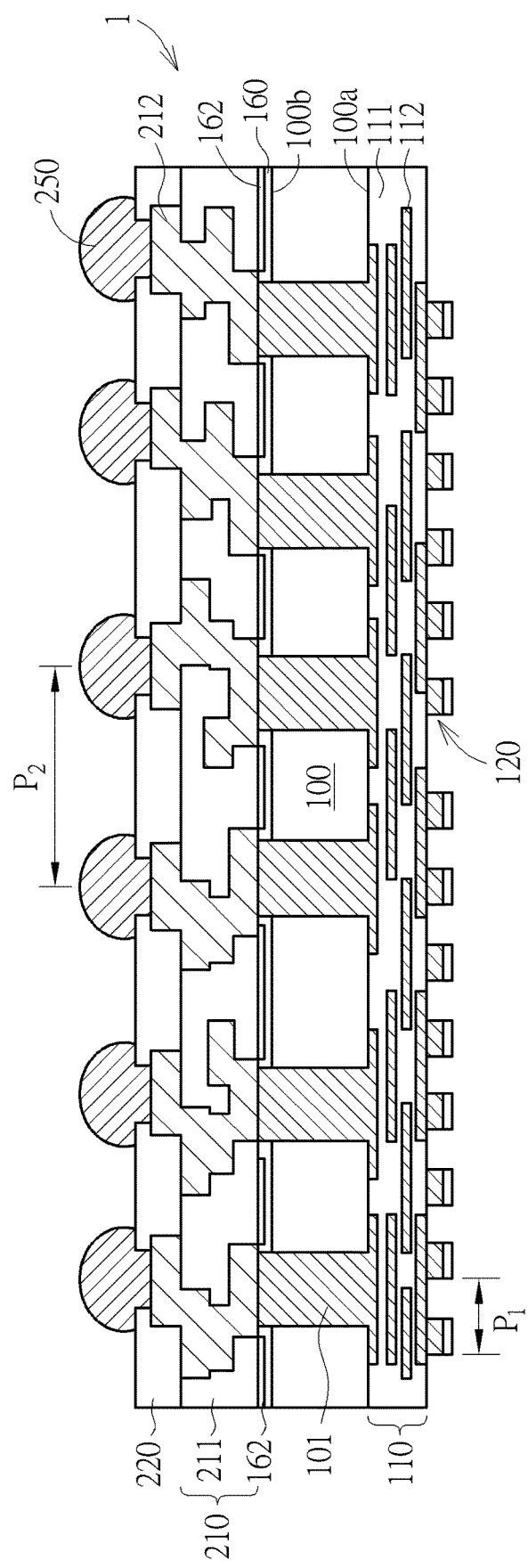

As shown in FIG. 8, a plurality of second connecting elements 250 is formed on the second RDL structure 210. According to the embodiment of the invention, a solder mask 220 may be formed on the second RDL structure 210. A plurality of solder mask openings may be formed in the solder mask 220. The second connecting elements 250 may be formed in the solder mask openings. A TSV-based silicon interposer 1 is completed. According to the embodiment of the invention, the silicon interposer 1 is a passive interposer. That is, no active device or active circuit is disposed in or on the substrate 100.

According to the embodiment of the invention, the second connecting elements 250 have a second pitch $P_2$, wherein the second pitch $P_2$ is greater than the first pitch $P_1$ of the first connecting elements 120. According to the embodiment of the invention, the plurality of second connecting elements 250 are ball grid array (BGA) balls and the second pitch $P_2$ ranges is greater than 50 um. The second pitch $P_2$ matches the ball pad pitch on a printed circuit board (PCB). According to the embodiment of the invention, the second pitch $P_2$ is equal to the ball pad pitch on a PCB.

It is advantageous to use the present invention because a conventional package substrate typically interposed between the silicon interposer and the PCB is spared. Therefore, the cost can be reduced and production yield can be improved.

According to the embodiment of the invention, the silicon interposer 1 comprises a substrate 100 having a frontside surface 100a and a backside surface 100b, a first redistribution layer (RDL) structure 110 disposed on the frontside surface 100a, a plurality of first connecting elements 120 disposed on the first RDL structure 110, a second RDL structure 210 disposed on the backside surface 100b, a plurality of second connecting elements 250 disposed on the second RDL structure 210, and a plurality of through silicon vias (TSVs) 101 in the substrate 100 to electrically connect the first RDL structure 110 to the second RDL structure 210. The first connecting elements 120 have a first pitch $P_1$. The second connecting elements 250 have a second pitch $P_2$. The second pitch $P_2$ is greater than the first pitch $P_1$.

Figure 9:
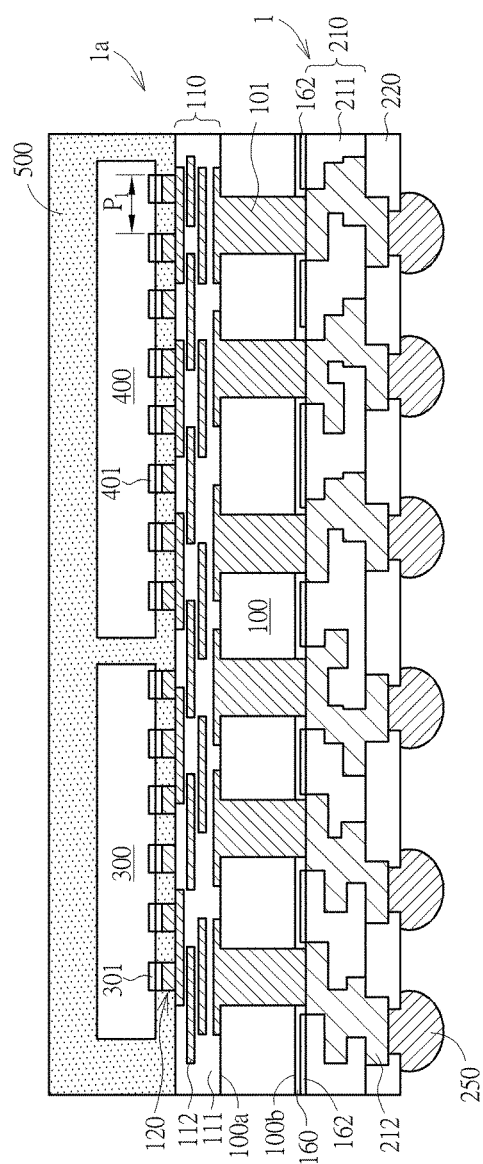
FIG. 9 is a schematic, cross-sectional diagram showing an exemplary semiconductor package in accordance with another embodiment of the invention.

FIG. 9 is a schematic, cross-sectional diagram showing an exemplary semiconductor package 1a in accordance with another embodiment of the invention, wherein like numeral numbers designate like layers, regions, or elements. As shown in FIG. 9, a first semiconductor die 300 is mounted on the first RDL structure 110 of the silicon interposer 1 through the plurality of first connecting elements 120. The first semiconductor die 300 is a flipped chip with its active surface facing the first RDL structure 110. The first semiconductor die 300 may comprise input/output (I/O) pads 301 on its active surface. The I/O pads 301 are aligned with some of the first connecting elements 120.

According to the embodiment of the invention, a second semiconductor die 400 is mounted on the first RDL structure 110 adjacent to the first semiconductor die 300. For example, the first semiconductor die 300 may comprise a central processing unit (CPU) and the second semiconductor die 400 may comprise a dynamic random access memory (DRAM) chip, but is not limited thereto. Optionally, a molding compound 500 may be formed on the first semiconductor die 300 and the second semiconductor die 400, and on the first RDL structure 110.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A silicon interposer, comprising:
   a substrate having a frontside surface and a backside surface;
   a first redistribution layer (RDL) structure disposed on the frontside surface;
   a plurality of first connecting elements disposed on the first RDL structure, wherein the plurality of first connecting elements have a first pitch;
   a second redistribution layer (RDL) structure disposed on the backside surface;
   a plurality of second connecting elements disposed on the second RDL structure, wherein the plurality of second connecting elements have a second pitch, wherein the second pitch is greater than the first pitch;
   a passivation layer on the backside surface;
   a dielectric layer on the passivation layer; and
   a plurality of through silicon vias (TSVs) in the substrate to electrically connect the first RDL structure to the second RDL structure, wherein the passivation layer surrounds ends of the plurality of the TSVs, and wherein the ends of the TSVs are flush with a top surface of the dielectric layer, and wherein the second RDL structure is in direct contact with the plurality of TSVs, the passivation layer and the dielectric layer.

2. The silicon interposer according to claim 1, wherein the substrate is a silicon substrate.

3. The silicon interposer according to claim 2, wherein no active device is disposed in or on the silicon substrate.

4. The silicon interposer according to claim 1, wherein the plurality of first connecting elements are micro bumps and the first pitch is greater than 5 um.

5. The silicon interposer according to claim 1, wherein the plurality of second connecting elements are ball grid array (BGA) balls and the second pitch is greater than 50 um.

6. The silicon interposer according to claim 1, wherein the first RDL structure comprises at least an inorganic dielectric film and a fine-pitch rewiring layer.

7. The silicon interposer according to claim 6, wherein the inorganic dielectric film comprises silicon oxide or silicon nitride.

8. The silicon interposer according to claim 6, wherein the fine-pitch rewiring layer comprises copper.

9. The silicon interposer according to claim 1, wherein the second RDL structure comprises at least an organic dielectric film and a trace.

10. The silicon interposer according to claim 9, wherein the organic dielectric film comprises benzocyclobutene (BCB) or polyimide (PI).

11. A semiconductor package, comprising:
a silicon interposer, comprising:
a substrate having a frontside surface and a backside surface;
a first redistribution layer (RDL) structure disposed on the frontside surface;
a plurality of first connecting elements disposed on the first RDL structure, wherein the plurality of first connecting elements have a first pitch;
a second redistribution layer (RDL) structure disposed on the backside surface;
a plurality of second connecting elements disposed on the second RDL structure, wherein the plurality of second connecting elements have a second pitch, wherein the second pitch is greater than the first pitch;
a passivation layer on the backside surface;
a dielectric layer on the passivation layer;
a plurality of through silicon vias (TSVs) in the substrate to electrically connect the first RDL structure to the second RDL structure, wherein the passivation layer surrounds ends of the plurality of the TSVs, and wherein the ends of the TSVs are flush with a top surface of the dielectric layer, and wherein the second RDL structure is in direct contact with the plurality of TSVs, the passivation layer and the dielectric layer; and
a first semiconductor die mounted on the first RDL structure through the plurality of first connecting elements.

12. The semiconductor package according to claim 11, wherein the first semiconductor die is a flipped chip with its active surface facing the first RDL structure.

13. The semiconductor package according to claim 12 further comprising a second semiconductor die mounted on the first RDL structure adjacent to the first semiconductor die.

14. The semiconductor package according to claim 13, wherein the first semiconductor die comprises a central processing unit (CPU) and the second semiconductor die comprises a dynamic random access memory (DRAM).

15. The semiconductor package according to claim 11, wherein the substrate is a silicon substrate.

16. The semiconductor package according to claim 15, wherein no active device is disposed in or on the silicon substrate.

17. The semiconductor package according to claim 11, wherein the plurality of first connecting elements are micro bumps and the first pitch is greater than 5 um.

18. The semiconductor package according to claim 11, wherein the plurality of second connecting elements are ball grid array (BGA) balls and the second pitch is greater than 50 um.

19. The semiconductor package according to claim 11, wherein the first RDL structure comprises at least an inorganic dielectric film and a fine-pitch rewiring layer.

20. The semiconductor package according to claim 19, wherein the inorganic dielectric film comprises silicon oxide or silicon nitride.

21. The semiconductor package according to claim 19, wherein the fine-pitch rewiring layer comprises copper.

22. The semiconductor package according to claim 11, wherein the second RDL structure comprises at least an organic dielectric film and a trace.

23. The semiconductor package according to claim 22, wherein the organic dielectric film comprises benzocyclobutene (BCB) or polyimide (PI).

* * * * *